United States Patent
Costa et al.

(10) Patent No.: US 7,577,898 B2
(45) Date of Patent: Aug. 18, 2009

(54) SYSTEM AND METHOD OF CORRECTING VIDEO DATA ERRORS

(75) Inventors: Pierre Costa, Austin, TX (US); Ahmad Ansari, Cedar Park, TX (US); David B. Hartman, Austin, TX (US); Brad Allen Medford, Austin, TX (US)

(73) Assignee: AT&T Intellectual Property I, L.P., Reno, NV (US)

( * ) Notice: Subject to any disclaimer, the term of this patent is extended or adjusted under 35 U.S.C. 154(b) by 446 days.

(21) Appl. No.: 11/400,908

(22) Filed: Apr. 10, 2006

(65) Prior Publication Data
US 2007/0250754 A1  Oct. 25, 2007

(51) Int. Cl.
*H03M 13/00* (2006.01)
(52) U.S. Cl. .................. 714/776; 714/784; 714/786
(58) Field of Classification Search ................. 714/752, 714/784, 786, 776
See application file for complete search history.

(56) References Cited

U.S. PATENT DOCUMENTS

| | | | |
|---|---|---|---|
| 6,850,519 B1 * | 2/2005 | Saito et al. ................. | 370/389 |
| 6,868,514 B2 | 3/2005 | Kubo et al. | |
| 6,981,200 B2 | 12/2005 | Maung et al. | |
| 2005/0009523 A1 * | 1/2005 | Pekonen ................ | 455/436 |
| 2005/0160346 A1 * | 7/2005 | Yamane ................ | 714/776 |
| 2005/0289615 A1 * | 12/2005 | Nishitani ............... | 725/88 |
| 2006/0291475 A1 * | 12/2006 | Cohen .................. | 370/395.42 |
| 2007/0186133 A1 * | 8/2007 | Stare .................... | 714/746 |
| 2007/0220405 A1 * | 9/2007 | Arnold et al. ............. | 714/776 |

OTHER PUBLICATIONS

PCT Search Report for International application No. PCT/US07/07783 mailed Sep. 11, 2008.

* cited by examiner

*Primary Examiner*—Esaw T Abraham
(74) *Attorney, Agent, or Firm*—Toler Law Group

(57) ABSTRACT

The present disclosure is directed to a system and method of correcting video data errors. In a particular embodiment, the method includes receiving a plurality of Internet Protocol (IP) video data packets at a generator of a video acquisition system. The method also includes calculating a first error correction code corresponding to a first error profile and generating a first forward error correction (FEC) packet to produce the first error correction code. The method also includes calculating a second error correction code corresponding to a second error profile and generating a second FEC packet to produce the second error correction code. Further, the method includes transmitting a stream of data packets including the plurality of IP video data packets, the first FEC packet and the second FEC packet, to a re-generator of an Internet Protocol video transport system, where an arbitrator of the re-generator identifies an error in the plurality of IP video data packets and selects one of a plurality of inverse FEC functions to correct the error.

16 Claims, 7 Drawing Sheets

SYSTEM AND METHOD OF CORRECTING VIDEO DATA ERRORS

FIELD OF THE DISCLOSURE

The present disclosure relates generally to correcting video data errors.

BACKGROUND

Television viewing is part of daily life for many people. Video transport service providers transmit video content to millions of viewers. As video content formats progress toward Internet Protocol (IP) delivery, equipment costs can decrease. Nonetheless, the quality of the video content can be affected by the volume and distribution of equipment required in networks that distribute IP video traffic. Streams of media packets can suffer from errors, including loss of data packets, which can cause gaps or freezes in video content. Retransmission of lost data packets can slow traffic over an IP network. Error correction packets can be included with streams of media packets, but it is often difficult for network administrators to predict the frequency and extent of packet loss. Depending on the complexity of the network, such predictions can be difficult. Hence, there is a need for an improved system and method of correcting video data errors.

DETAILED DESCRIPTION OF THE DRAWINGS

Figure 1:
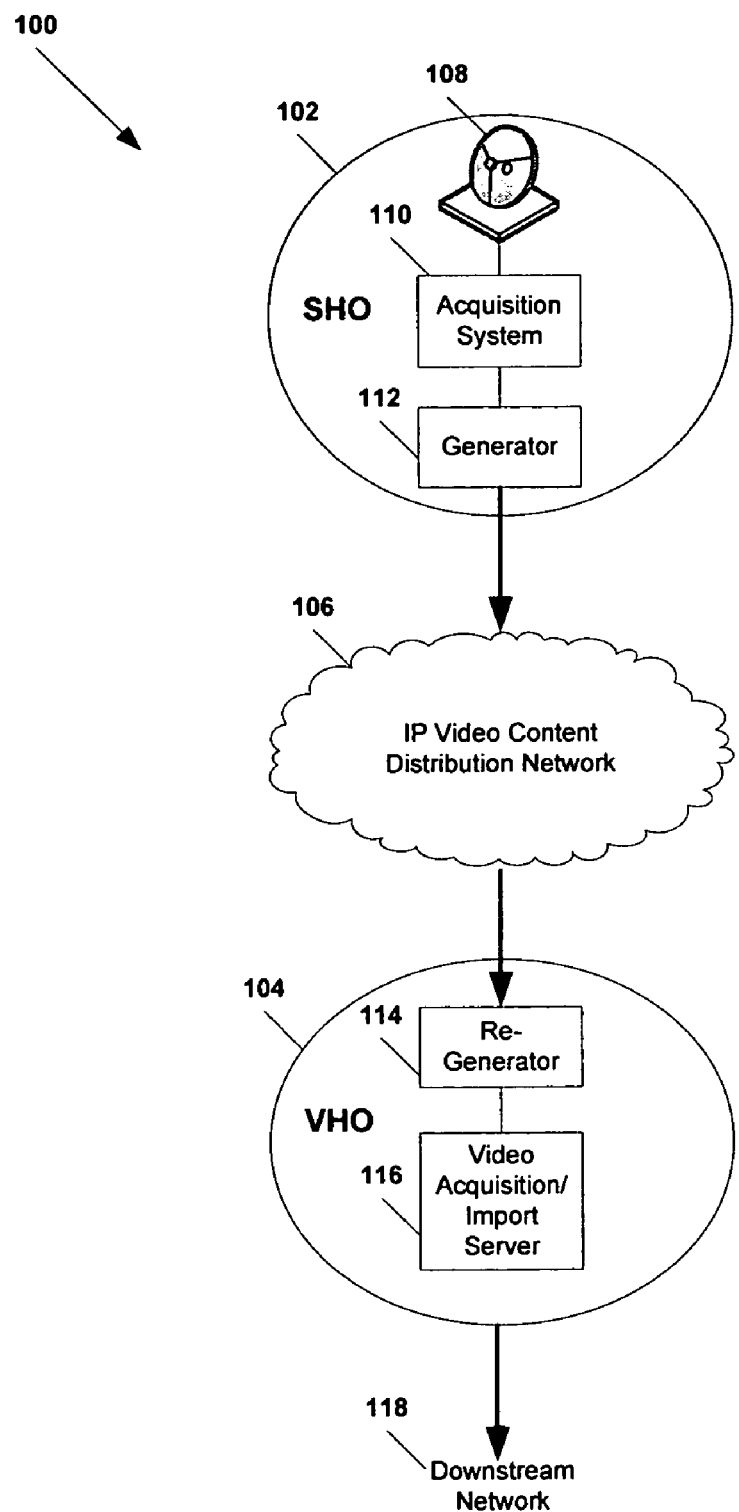
FIG. 1 is a block diagram illustrating a particular embodiment of a system to correct video data errors.

The present disclosure is directed to a system to correct video data errors. In a particular embodiment, the system includes a generator having a processor and a memory device. The memory device includes a data packet module executable by the processor to receive a plurality of Internet Protocol (IP) video data packets. The memory device also includes a forward error correction (FEC) module executable by the processor to calculate a plurality of error correction codes for the plurality of IP video data packets, each error correction code corresponding to one of a plurality of error profiles. The FEC module is executable by the processor to generate a plurality of FEC packets, each FEC associated with one of the plurality of error correction codes. Further, the memory device includes a transmission module executable by the processor to transmit a stream of data packets including the plurality of IP video data packets and the plurality of FEC packets to a re-generator of an Internet Protocol video transport system. In addition, the re-generator identifies an error in the plurality of IP video data packets and selects one of a plurality of inverse FEC functions to correct the error.

In another embodiment, a system to correct video data errors is disclosed and includes a re-generator having a processor and a memory device. The memory device includes a data packet receipt module executable by the processor to receive a stream of data packets including a plurality of initial Internet Protocol (IP) video data packets and a plurality of forward error correction (FEC) packets. The memory device also includes an error module executable by the processor to determine that the plurality of initial IP video data packets includes an error having an error profile. Further, the memory device includes an arbitrator module executable by the processor to select one of a plurality of inverse FEC functions to correct the error.

In another embodiment, a method of correcting video data errors is disclosed and includes receiving a plurality of Internet Protocol (IP) video data packets at a generator of a video acquisition system. The method also includes calculating a first error correction code corresponding to a first error profile and generating a first forward error correction (FEC) packet to produce the first error correction code. The method also includes calculating a second error correction code corresponding to a second error profile and generating a second FEC packet to produce the second error correction code. Further, the method includes transmitting a stream of data packets including the plurality of IP video data packets, the first FEC packet and the second FEC packet, to a re-generator of an Internet Protocol video transport system, where an arbitrator of the re-generator identifies an error in the plurality of IP video data packets and selects one of a plurality of inverse FEC functions to correct the error.

In another embodiment, a method of correcting video data errors is disclosed and includes receiving a stream of data packets at a re-generator of an Internet Protocol video transport system, where the stream includes a plurality of IP media packets and a plurality of forward error correction (FEC) packets. The method also includes determining an error profile of an error within the plurality of IP media packets. The method also includes identifying one of the plurality of FEC packets, where the identified FEC packet is associated with an error correction code corresponding to the error profile. Further, the method includes selecting an inverse FEC function from a plurality of inverse FEC functions, where the selected inverse FEC function corresponds to the identified FEC packet.

In another embodiment, a computer program embedded in a computer-readable medium is disclosed and includes instructions to receive a plurality of Internet Protocol (IP) video data packets. The computer program also includes instructions to calculate a plurality of error correction codes for the plurality of IP video data packets, each error correction code corresponding to one of a plurality of error profiles. The computer program also includes instructions to generate a plurality of FEC packets, each FEC packet associated with one of the plurality of error correction codes. The computer program also includes instructions to transmit a stream of data packets including the plurality of IP video data packets and the plurality of FEC packets to a re-generator of an Internet Protocol video transport system, where an arbitrator of the re-generator identifies an error in the plurality of IP video data packets and selects one of a plurality of inverse FEC functions to correct the error.

In another embodiment, a computer program embedded in a computer-readable medium is disclosed and includes instructions to receive a stream of data packets including a plurality of initial Internet Protocol (IP) video data packets and a plurality of forward error correction (FEC) packets. The computer program also includes instructions to determine that the plurality of initial IP video data packets includes an error having an error profile. The computer program also includes instructions to select one of a plurality of inverse FEC functions to correct the error.

Referring to FIG. 1, a particular embodiment of a system to correct video data errors is illustrated and designated generally at 100. The system 100 includes a video content acquisition system 102 that communicates with a video content transport system 104 via an Internet Protocol (IP) video content distribution network 106. In an illustrative embodiment, the video content acquisition system 102 can be within a satellite head-end office (SHO) and can include a satellite dish 108 coupled to an acquisition system 110. The acquisition system 110 can include, for example, a low-noise blockdown (LNB) converter that is coupled to or integrated with a satellite signal decoder. The acquisition system 110 is coupled to a generator 112 that communicates with the IP video content distribution network 106.

In a particular embodiment, the video content transport system 104 can be within a video head-end office (VHO) and can include a re-generator 114 that communicates with a video acquisition/import server 116. The re-generator 114 receives IP video data packets or other IP media packets from the generator 112. The re-generator 114 can correct errors in the IP media packets and send them to the video acquisition/import server 116. In an illustrative embodiment, the video acquisition/import server 116 can send the IP media packets via a downstream IP television (IPTV) network 118, for example, to a central office of a video content service provider.

In a particular embodiment, a satellite signal can be received at the satellite dish 108. The acquisition system 110 can include hardware logic, computer program instructions, or any combination thereof, to decode the satellite signal, for example, by removing a radio frequency (RF) portion and producing a Moving Picture Experts Group (MPEG) transport stream signal or other media transport stream signal that includes a plurality of IP media packets, such as Internet Protocol (IP) video data packets. The acquisition system 110 sends the plurality of IP media packets to the generator 112. In an illustrative embodiment, the media packets can include user datagram protocol (UDP) packets, real-time transport protocol (RTP) packets, other IP data packets, or any combination thereof.

The generator 112 receives a stream of IP media packets and generates forward error correction (FEC) packets to produce error correction codes related to a plurality of different error profiles. In an illustrative embodiment, the generator 112 generates FEC packets that include algorithms to produce error correction codes related to at least two error profiles, such as a short burst packet loss and a long burst packet loss. For example, the generator 112 can generate a first FEC packet to produce an error correction code related to a short burst packet loss of approximately five packets, and a second FEC packet to produce an error correction code related to a long service interruption of approximately three hundred packets. In another embodiment, the generator 112 can generate FEC packets to produce error correction codes related to other error profiles. Error profiles can be pre-defined or determined, for instance, through observation and statistical evaluation of network performance.

A transmitter portion of the generator 112 can transmit a stream of data packets that includes the IP media packets and the plurality of generated FEC packets to the re-generator 114 via the IP video content distribution network 106. The re-generator 114 can buffer each of the FEC packets in one of a plurality of receiver queues or buffers. Further, the re-generator 114 can calculate a plurality of inverse FEC (FEC$^{-1}$) functions, each of which is based on one of the plurality of FEC packets. In a particular embodiment, the re-generator 114 can include an arbitrator that determines a profile of an error in the plurality of IP media packets and selects a FEC$^{-1}$ function that is suited to correct the error.

For instance, the arbitrator can determine whether the FEC packet in the first receiver queue is associated with an error correction code that is configured to correct errors that match the determined profile. If the FEC packet in the first receiver queue is not associated with such an error correction code, the arbitrator can determine whether the FEC packet in the second receiver queue is associated with an error correction code that is configured to correct errors that match the determined profile. Once the arbitrator identifies a FEC packet that is associated with such an error correction code, the FEC$^{-1}$ function corresponding to the identified FEC packet can be applied to the remaining IP media packets and the identified FEC packet, in order to reconstruct one or more errored packets, such as lost packets. The video content transport system 104 can transmit a corrected stream of IP media packets that includes the unerrored IP media packets and the reconstructed IP media packets to a central office or other location via the downstream network 118.

Figure 2:
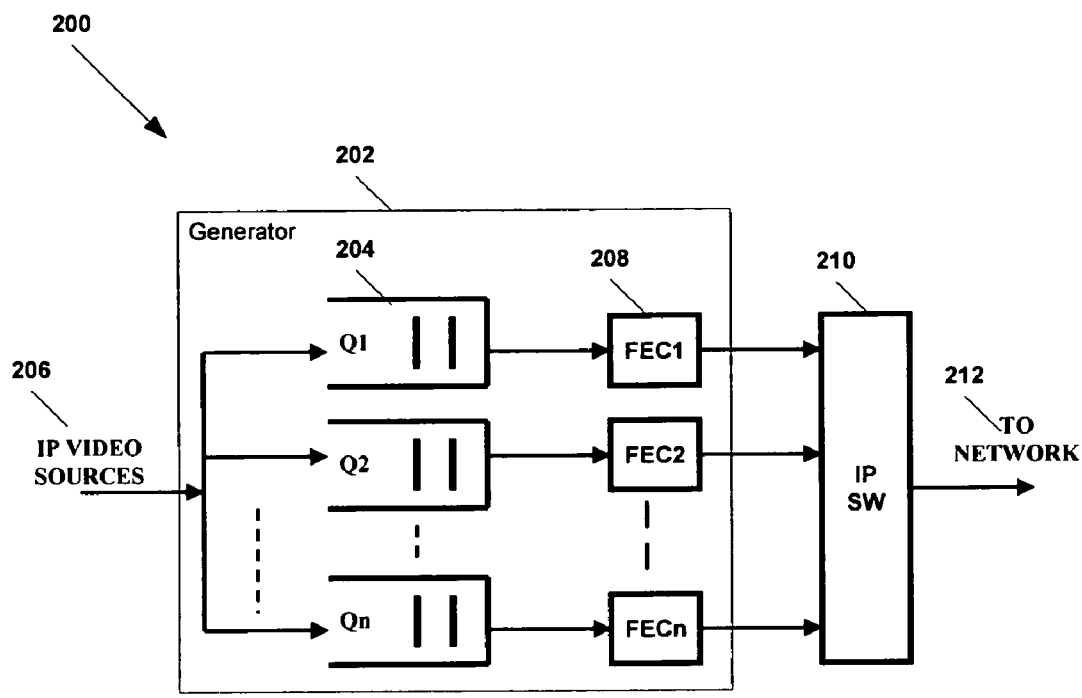
FIG. 2 is a block diagram illustrating a second particular embodiment of a system to correct video data errors.

Referring to FIG. 2, a second particular embodiment of a system to correct video data errors is illustrated and designated generally at 200. The system 200 includes a generator 202, such as the generator 112 illustrated in FIG. 1. The generator 202 includes a plurality of queues 204, such as Q1, Q2 . . . Q(n). In an illustrative embodiment, the generator 202 receives a plurality of IP video data packets from an IP video content source 206, such as the acquisition system 110 illustrated in FIG. 1. Each queue 204 generates a forward error correction (FEC) packet 208, such as FEC1, FEC2 . . . FEC (n), based on the plurality of IP video data packets. Each FEC packet 208 is associated with a different error correction code corresponding to a packet loss characteristic or other error profile.

For example, Q1 can generate a FEC1 packet based on the plurality of IP video data packets to produce a first error correction code corresponding to a first error profile, such as a short burst loss. Q2, on the other hand, can generate a FEC2 packet based on the plurality of IP video data packets to produce a second error correction code corresponding to a second error profile, such as a long service interruption. In a particular embodiment, the generator 202 can include at least one next queue Q(n), each of which generates at least one FEC(n) packet based on the plurality of IP video data packets to produce a next error correction code corresponding to a next error profile. In an illustrative embodiment, error correction codes can include a Pro-Moving Picture Experts Group Code of Practice 3-based (Pro-MPEG COP3-based) code, a Reed-Solomon code, a Luby Transform code, a Raptor code, a Golay code, a Hamming code, a Bose/Ray-Chaudhuri/Hocquenghem (BCH) code, a turbo-based code, a convolutional code, an interleaver, any other suitable error correction code, or any combination thereof.

In a particular embodiment, the generator 202 transmits a stream of data packets that includes the plurality of IP video data packets and the plurality of generated FEC packets to a video content transport system, such as a video head-end office, via an edge device of an IP network 212. For example, the generator 202 can communicate with an IP switch 210 of the IP video content distribution network 106 illustrated in FIG. 1.

Figure 3:
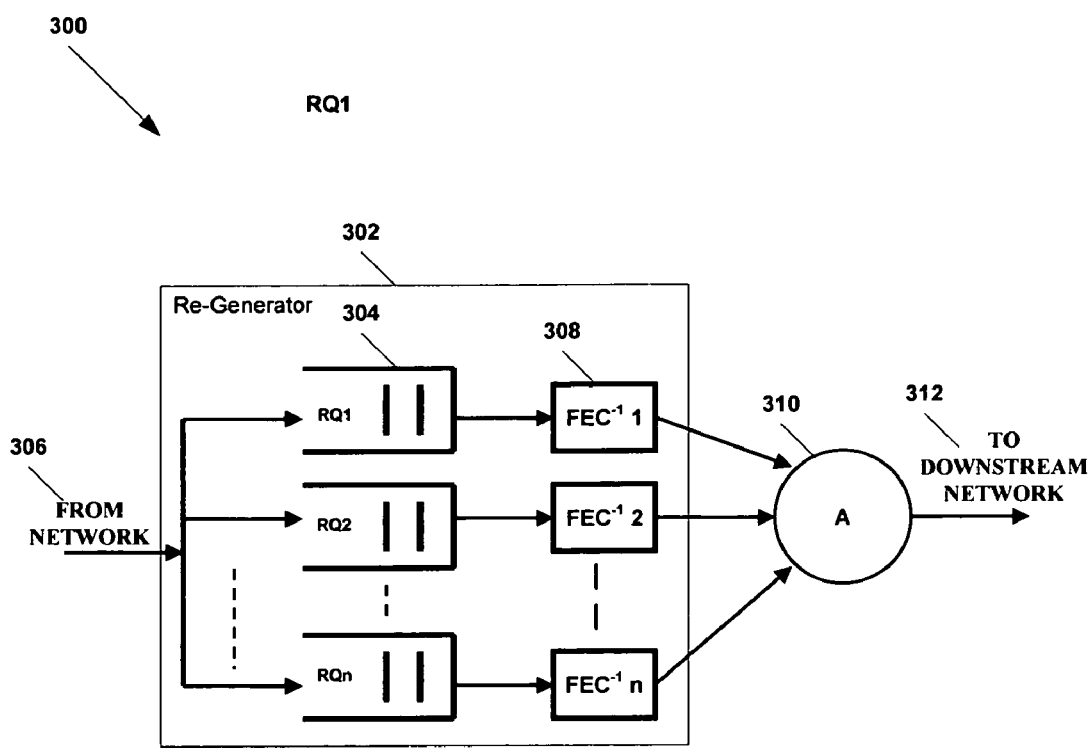
FIG. 3 is a block diagram illustrating a third particular embodiment of a system to correct video data errors.

Referring to FIG. 3, a third particular embodiment of a system to correct video data errors is illustrated and designated generally at 300. The system 300 includes a re-generator 302, such as the re-generator 114 illustrated in FIG. 1. The re-generator 302 includes a plurality of receiver queues 304, such as RQ1, RQ2 . . . RQ(n). In an illustrative embodiment, the re-generator 302 receives a stream of data packets from an IP network 306, such as the IP video content distribution network 106 illustrated in FIG. 1 or the IP network 212 illustrated in FIG. 2. The stream of data packets includes a plurality of IP media packets and a plurality of forward error correction (FEC) packets, such as the FEC1, FEC2 . . . FEC(n) packets illustrated at 208 in FIG. 2. Each receiver queue 304 can store one of the plurality of FEC packets received with the stream of data packets. The re-generator 302 can calculate an inverse FEC ($FEC^{-1}$) function based each of the FEC packets. In an illustrative embodiment, the re-generator can produce a plurality of $FEC^{-1}$ blocks 308, such as $FEC^{-1}$ 1, $FEC^{-1}$ 2 . . . $FEC^{-1}$ n, each of which is associated with one of the calculated $FEC^{-1}$ functions.

The re-generator 302 determines whether packet loss or other errors exist within the plurality of IP media packets. For instance, the re-generator 302 can determine whether gaps exist in sequence numbers associated with the plurality of IP media packets. If the re-generator 302 determines that packets have been lost, it notifies an arbitrator 310, which determines an error correction path to reconstruct the lost packets.

In an illustrative embodiment, the arbitrator 310 can determine a profile of an error within the plurality of IP media packets, such as a number of lost packets. The arbitrator 310 can determine whether the FEC packet in the first receiver queue is associated with an error correction code that is configured to correct errors that match the determined profile. If the FEC packet in the first receiver queue is not associated with such an error correction code, the arbitrator can determine whether the FEC packet in the second receiver queue is associated with an error correction code that is configured to correct errors that match the determined profile. Once the arbitrator 310 identifies a FEC packet that is associated with such an error correction code, the corresponding $FEC^{-1}$ function can be applied to the remaining IP media packets in the and the identified FEC packet, in order to reconstruct one or more lost packets. For example, if the FEC packet in the second receiver queue includes an algorithm to produce an error correction code that is configured to correct errors that match the determined profile, the re-generator 302 can apply the function in the $FEC^{-1}$ 2 block to the remaining IP media packets and the FEC packet buffered in RQ2 to reconstruct the lost data packets. In a particular embodiment, the re-generator 302 can transmit a corrected stream of IP media packets to a central office or other location via the downstream network 312.

Figure 4:
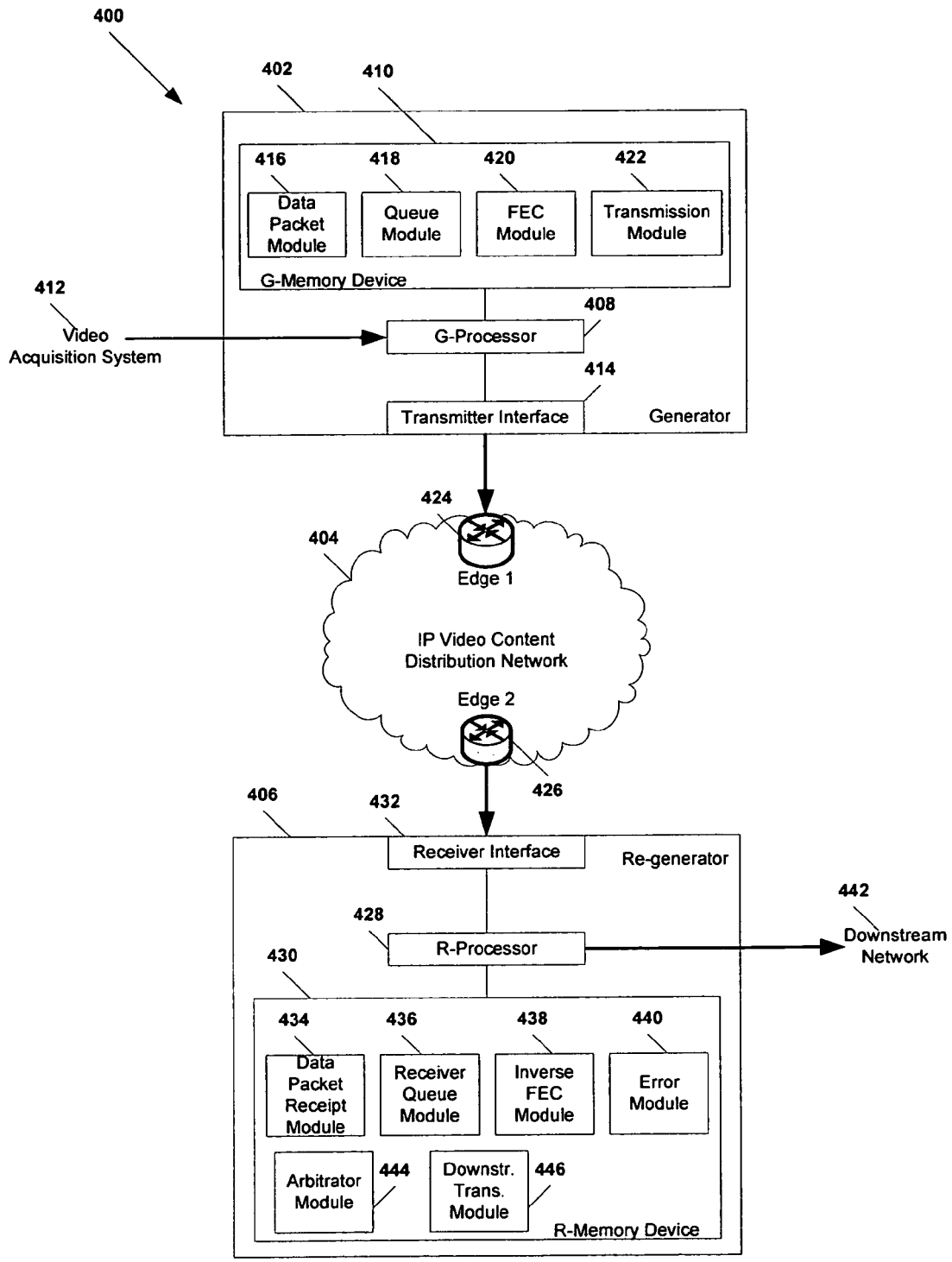
FIG. 4 is a block diagram illustrating a fourth particular embodiment of a system to correct video data errors.

Referring to FIG. 4, a fourth particular embodiment of a system to correct video data errors is illustrated and is designated generally at 400. The system 400 includes a generator 402 that communicates with a re-generator 404 via an Internet Protocol (IP) video content distribution network 406. In a particular embodiment, the generator 402 can be part of a video content acquisition system at a satellite head-end office (SHO) of a video service provider, and the re-generator 404 can be part of a video content transport system within a video head-end office (VHO) of the video service provider. In an illustrative, non-limiting embodiment, the generator 402 can communicate with the IP video content distribution network 406 via a first network edge device 424, and the re-generator 404 can communicate with the IP video content distribution network 406 via a second network edge device 426.

In a particular embodiment, the generator 402 includes a generator processor (G-processor) 408 and a generator memory device (G-memory device) 410 that is accessible to the G-processor 408. The G-processor 408 can communicate with the IP video content distribution network 406 via a transmitter interface 414. In an illustrative embodiment, the G-processor 408 can communicate with a video acquisition system 412, such as an acquisition system of a satellite head-end office.

In a particular embodiment, the G-memory device 410 can include a data packet module 416 that is executable by the G-processor 408 to communicate with the video acquisition system 412 to receive a plurality of IP video data packets or other IP media packets. In addition, the G-memory device 410 can include a queue module 418 that is executable by the G-processor 408 to maintain a plurality of queues that includes at least a first queue and a second queue. The plurality of queues can include at least one next queue in addition to the first and second queues. In a particular embodiment, each of the plurality of queues is associated with a different error profile, such as a packet loss profile.

The G-memory device 410 can include a forward error correction (FEC) module 420 that is executable by the G-processor 408 to calculate a plurality of error correction codes based on the plurality of IP video data packets. Each of the error correction codes corresponds to an error profile associated with one of the plurality of queues. Further, the FEC module 420 can be executable by the G-processor 408 to generate a plurality of FEC packets, each of which is associated with one of the plurality of error correction codes. In an illustrative embodiment, each of the FEC packets can include an algorithm to produce one of the calculated error correction codes.

In a particular embodiment, the data packet module 416 can be executable by the G-processor 408 to receive a plurality of IP video data packets from the video acquisition system 412. The queue module 418 can be executable by the G-processor 408 to place the plurality of IP video data packets in a first queue. The FEC module 420 can be executable by the G-processor 408 to generate, or cause the first queue to generate, a first FEC packet based on the plurality of IP video packets. For instance, the first FEC packet can include an algorithm to produce a first error correction code corresponding to a first error profile, such as a short burst loss. Additionally, the queue module 418 can be executable by the G-processor 408 to place the stream of IP video data packets in a second queue. The FEC module 420 can be executable by the G-processor 408 to generate, or cause the second queue to generate, a second FEC packet based on the plurality of IP video packets. For instance, the second FEC packet can include an algorithm to produce a second error correction code corresponding to a second error profile, such as a long service interruption.

In an illustrative embodiment, the queue module 418 can be executable by the G-processor 408 to place the stream of IP video data packets in at least one next queue, and the FEC module 420 can be executable by the G-processor 408 to generate, or cause the at least one next queue to generate, at least one next FEC packet based on the plurality of IP video packets. For instance, each next FEC packet can include an algorithm to produce a next error correction code corresponding to a next error profile.

In addition, the G-memory device 410 can include a transmission module 422 that is executable by the G-processor 408 to transmit the stream of IP video data packets or other media packets, with the plurality of generated FEC packets, to the re-generator 404 via the transmitter interface 414.

The re-generator 404 includes a re-generator processor (R-processor) 428 and a re-generator memory device (R-memory device) 430. The R-processor 428 communicates with a second edge device 426 of the IP video content distribution network 406 via a receiver interface 432. In an illustrative embodiment, the R-processor 428 can communicate via a downstream video content delivery network 442, for example, with a video service provider central office (VCO).

In a particular embodiment, the R-memory device 430 includes a data packet receipt module 434 that is executable by the R-processor 428 to receive a stream of data packets that includes a plurality of IP video data packets or other IP media packets and a plurality of FEC packets, via the receiver interface 432. In addition, the R-memory device 430 can include a receiver queue module 436 that is executable by the R-processor 428 to maintain a plurality of queues that includes at least a first receiver queue and a second receiver queue. The plurality of receiver queues can include at least one next receiver queue in addition to the first and second receiver queues. In a particular embodiment, each of the plurality of receiver queues buffers one of the plurality of FEC packets received at the re-generator 406. Further, the R-memory device 430 can include an inverse FEC module 438 that is executable by the R-processor 428 to produce a plurality of inverse FEC blocks ($FEC^{-1}$ blocks). Each $FEC^{-1}$ block includes a $FEC^{-1}$ function calculated based on a FEC packet in one of the receiver queues.

In an illustrative embodiment, the R-memory device 430 can include an error module 440 that is executable by the R-processor 428 to determine whether packet loss or other errors exist within, for example, a received plurality of IP video data packets. For instance, the error module 440 can be executable by the R-processor 428 to determine whether gaps exist in sequence numbers associated with the IP video data packets. The error module 440 can also be executable by the R-processor 428 to determine a profile of an error, such as a number of lost packets or an amount of time lost from video content. The R-memory device 430 includes an arbitrator module 444 that is executable by the R-processor 428 to determine which of the $FEC^{-1}$ blocks created by the inverse FEC module 438 should be used to correct an error in the plurality of IP video data packets, based on the error profile.

In an illustrative embodiment, the arbitrator module 444 can be executable by the R-processor 428 to determine whether the FEC packet in the first receiver queue is associated with an error correction code to correct errors that match the determined profile. If the FEC packet in the first receiver queue is not associated with such an error correction code, the arbitrator module 444 can be executable by the R-processor 428 to determine whether the FEC packet in the second receiver queue is associated with an error correction code to correct errors that match the determined profile. The arbitrator module 444 can be executable by the R-processor 428 to repeat this process until it identifies a FEC packet that is associated with such an error correction code. For example, if the error profile is a loss of five data packets, the process can be repeated until a FEC packet is identified that contains an algorithm to produce an error correction code corresponding to a loss of five packets.

The error module 440 can be executable by the R-processor 428 to reconstruct data packets containing data errors, reconstruct lost data packets, or any combination thereof. In one embodiment, the error module 440 can be executable by the R-processor 428 to apply the $FEC^{-1}$ function calculated based on the identified FEC packet to the remaining (e.g., unlost) IP media packets and the identified FEC packet, in order to reconstruct one or more IP media packets. In a particular embodiment, the R-memory device 430 can include a downstream transmission module 446 that is executable by the processor 428 to transmit the corrected stream of media packets to a central office or other location via the downstream network 442.

Figure 5:
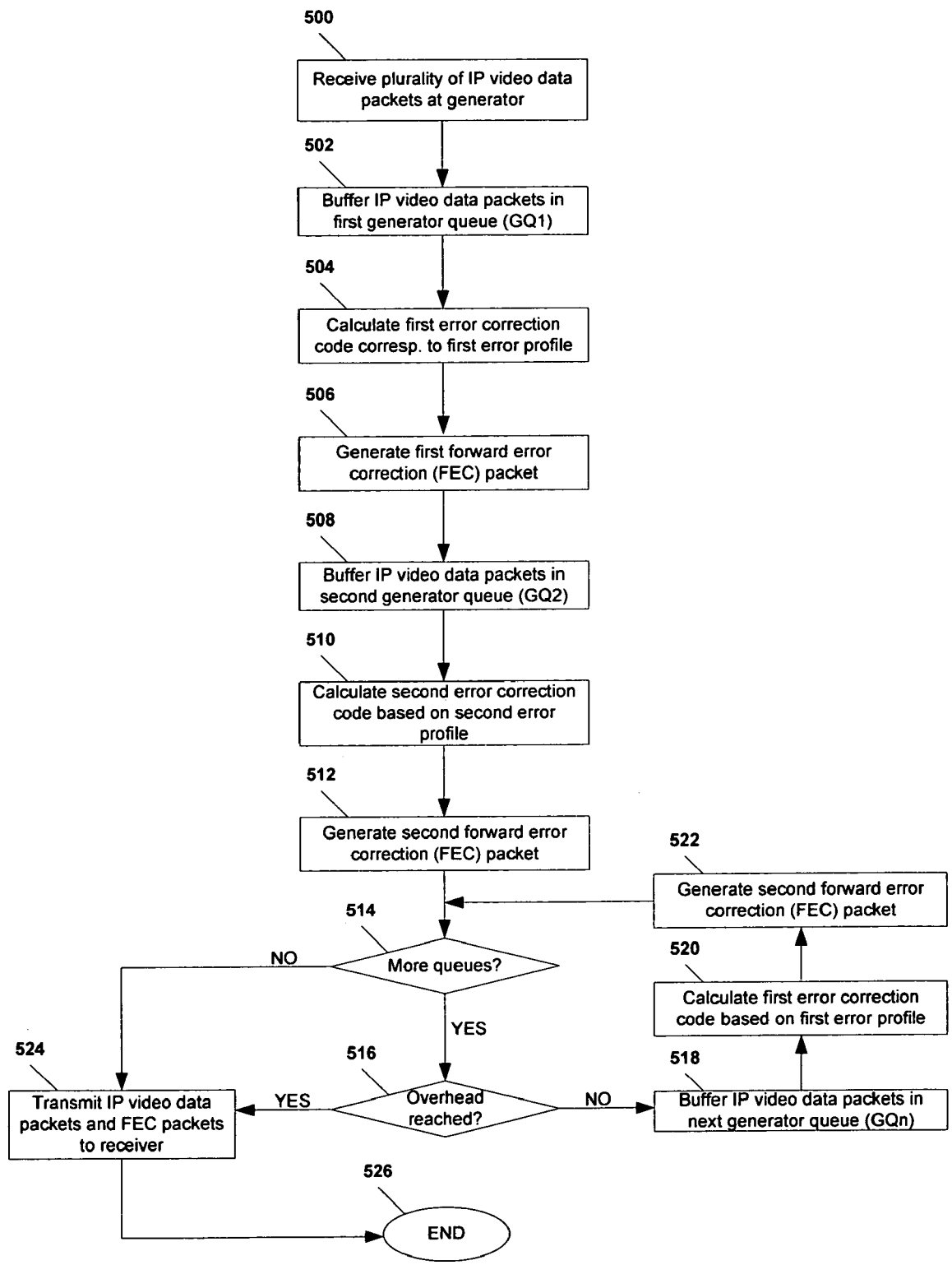
FIG. 5 is a flow diagram of a particular embodiment of a method of correcting video data errors.

Referring to FIG. 5, a particular embodiment of a method of correcting video data errors is illustrated. At block 500, a plurality of IP video data packets is received at a generator. In an illustrative embodiment, the IP video data packets can be received from a video acquisition system. Moving to block 502, the plurality of IP video data packets is buffered in a first generator queue (GQ1). Proceeding to block 504, a first error correction code corresponding to a first error profile is calculated based on the plurality of IP video data packets. For example, an error correction code corresponding to a long service interruption, e.g., a loss of three hundred packets from the plurality of IP video data packets, can be calculated. The method continues to block 506, and a first forward error correction (FEC) packet is generated to produce the first error correction code.

At block 508, the plurality of IP video data packets is buffered in a second generator queue (GQ2). Proceeding to block 510, a second error correction code corresponding to a second error profile is calculated based on the plurality of IP video data packets. For example, an error correction code corresponding to a short burst loss, e.g., a loss of ten packets from the plurality of IP video data packets, can be calculated. The method continues to block 512, and a second forward error correction (FEC) packet is generated to produce the second error correction code.

Moving to decision step 514, in a particular embodiment, the generator can determine whether additional queues exist to generate FEC packets related to other error profiles. If no additional queues exist, the method proceeds to block 524. Conversely, if other queues exist, the method continues to decision step 516, and the generator determines whether a threshold overhead has been reached. For instance, the generator, the plurality of IP video data packets, or any combination thereof, may only allow for five FEC packets for every fifty IP video data packets. If this proportion has been reached, the method proceeds to block 524. On the other hand, if the threshold overhead has not been reached, the method advances to block 518.

At block 518, the plurality of IP video data packets is buffered in a next generator queue (GQn). Proceeding to block 520, a next error correction code corresponding to a next error profile is calculated based on the plurality of IP video data packets. The method continues to block 522, and a next forward error correction (FEC) packet is generated to produce the next error correction code. The method then returns to decision step 514, and the generator determines whether any more queues exist. Once all queues have been exhausted, or the overhead threshold reached, the method proceeds to block 524, and a stream of data packets including the plurality of IP video data packets and the plurality of created FEC packets is transmitted to a receiver or re-generator at a video content transport system. The method then terminates at 526.

Figure 6:
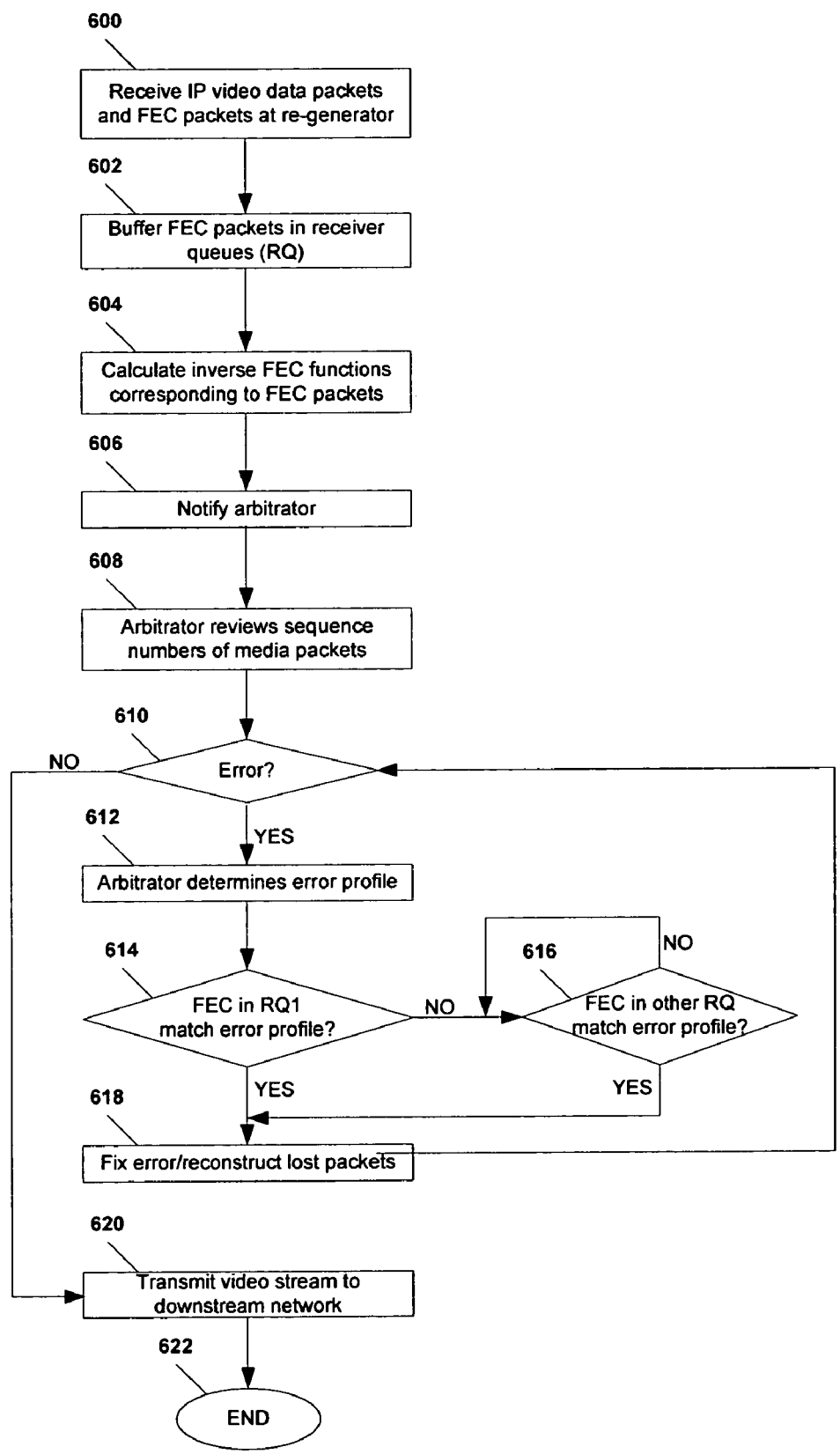
FIG. 6 is a flow diagram of a second particular embodiment of a method of correcting video data errors.

Referring to FIG. 6, a second particular embodiment of a method of correcting video data errors is illustrated. At block 600, a stream of data packets including a plurality of IP video data packets and a plurality of created FEC packets is received at a re-generator of a video content transport system. Moving to block 602, each of the FEC packets is buffered in a separate receiver queue (RQ). For example, a first FEC packet (FEC1) can be buffered in a first receiver queue (RQ1); a second FEC packet (FEC2) can be buffered in a second receiver queue (RQ2); a next FEC packet (FECn) can be buffered in a next receiver queue (RQn), and so on.

Proceeding to block 604, the re-generator calculates a plurality of inverse FEC (FEC$^{-1}$) functions. Each of the FEC$^{-1}$ functions corresponds to one of the FEC packets. For example, the re-generator can calculate a first FEC$^{-1}$ function (FEC$^{-1}$ 1) corresponding to an algorithm in the FEC1 packet; a second FEC$^{-1}$ function (FEC$^{-1}$ 2) corresponding to an algorithm in the FEC2 packet; a next FEC$^{-1}$ function (FEC$^{-1}$ n) corresponding to an algorithm in the FEC n packet; and so on. In a particular embodiment, the method moves to block 606, and an arbitrator portion or module of the re-generator is notified that the stream of data packets has been received and that FEC$^{-1}$ functions corresponding to the plurality of FEC packets have been calculated. The method continues to block 608.

At block 608, in a particular embodiment, the arbitrator can review sequence numbers included with the plurality of IP video data packets and determine whether there are any gaps. The method proceeds to decision step 610, and the arbitrator determines whether there are any errors, such as lost packets, based on the sequence numbers. If there are no errors, the method proceeds to block 620. On the other hand, if there are errors in the plurality of IP video data packets, the method moves to block 612, and the arbitrator determines an error profile, such as a number of lost packets, a time of lost video content, or any combination thereof. The method then continues to decision step 614.

At decision step 614, in an illustrative embodiment, the arbitrator can determine whether the FEC1 packet buffered in RQ1 is associated with an error correction code to repair an error corresponding to the error profile determined by the arbitrator. If the arbitrator determines that the FEC 1 packet is associated with such an error correction code, the method moves to block 618. Conversely, if the arbitrator determines that the FEC1 packet is not associated with such an error correction code, the method moves to decision step 616. At decision step 616, the arbitrator determines whether a FEC packet buffered in another of the receiver queues is associated with an error correction code to repair an error corresponding to the error profile determined by the arbitrator. If the arbitrator determines that the FEC packet is not associated with such an error correction code, the method returns to decision step 616. Whereas, after the arbitrator identifies a FEC packet that is associated with such an error correction code, the method advances to block 618.

Proceeding to block 618, the re-generator repairs the error in the stream of media packets, for example, by reconstructing lost packets or packets containing data errors. In an illustrative embodiment, the re-generator can apply the FEC$^{-1}$ function corresponding to the identified FEC packet to the remaining (i.e., unlost) IP video data packets and the identified FEC packet, in order to reconstruct one or more lost or errored packets. For instance, if the arbitrator determines that a FEC9 packet buffered in a ninth receiver queue (RQ9) is associated with an error correction code to repair an error having the profile determined by the arbitrator, then an error correction module or other portion of the re-generator can apply a FEC$^{-1}$ 9 function calculated by the re-generator based on the FEC9 packet to the unlost or unerrored media packets and to the FEC 9 packet, in order to reconstruct the lost or errored IP video data packets.

In an illustrative, non-limiting embodiment, the method can return to decision step 610, and it can be determined whether any errors still exist in the plurality of IP video data packets. Once the arbitrator determines that no further errors exist in the plurality of IP video data packets, the method advances to block 620, and the plurality of IP video data packets is transmitted to a video central office or other video transport service location via a downstream network. The method terminates at 622.

In a particular embodiment, the steps of the methods described herein are executed in the order shown by the figures. In alternative embodiments, the steps may be executed in alternative sequences. Additionally, those skilled in the art will recognize that the arbitrator can inspect the FEC packets buffered in the receiver queues in any order.

In conjunction with the configuration of structure described herein, the system and method disclosed provide correction of video data errors having multiple error profiles. In a particular embodiment, a transmitter or generator calculates a plurality of error correction codes for a plurality of IP video data packets or other IP media packets. Each error correction code corresponds to a different error profile, such as a number of lost packets, errored or corrupted packets, or any combination thereof. The generator creates a plurality of forward error correction (FEC) packets, each of which is associated with one of the calculated error correction codes. The generator transmits a stream of data packets including the plurality of IP media packets and the plurality of FEC packets to a receiver or regenerator.

In an illustrative embodiment, the regenerator buffers each of the plurality of FEC packets in a different receiver queue and calculates a plurality of inverse FEC functions (FEC$^{-1}$ functions). Each FEC$^{-1}$ function corresponds to one of the FEC packets. The re-generator determines whether one or more errors, such as lost packets, errored or corrupted packets, or any combination thereof, exist in the stream of media packets. In one embodiment, an arbitrator can determine a profile of an error and can select one of the plurality of FEC$^{-1}$ functions to repair the error, for example, by reconstructing lost packets, errored or corrupted packets, or any combination thereof. For example, the arbitrator can inspect each of the FEC packets buffered in the receiver queues until it identifies a FEC packet that is associated with an error correction code that corresponds to the error profile determined by the arbitrator. Once the arbitrator identifies such a FEC packet, the re-generator can apply the corresponding FEC$^{-1}$ function to the remaining (unlost/unerrored) media packets and the identified FEC packet, in order to reconstruct the lost or errored data packets. In an illustrative, non-limiting embodiment, the re-generator can send the corrected media stream to a video central office or other video transport system via a downstream network.

Figure 7:
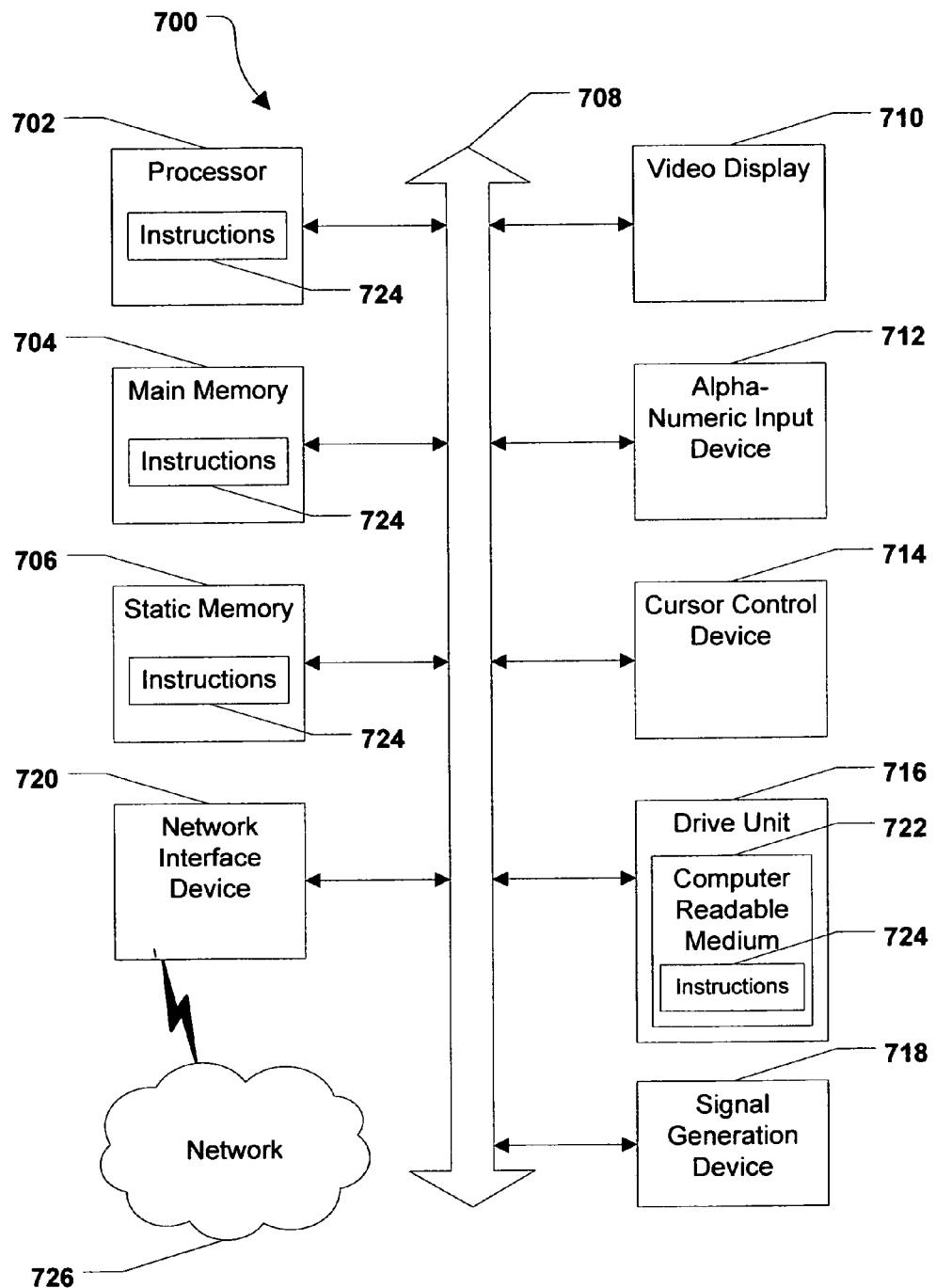
FIG. 7 is a diagram of an embodiment of a general computer system.

Referring to FIG. 7, an illustrative embodiment of a general computer system is shown and is designated 700. The computer system 700 can include a set of instructions that can be executed to cause the computer system 700 to perform any one or more of the methods or computer based functions disclosed herein. The computer system 700, or any portion thereof, may operate as a standalone device or may be connected, e.g., using a network, to other computer systems or peripheral devices, including a server, generator, re-generator, or other device, as shown in FIGS. 1-4.

In a networked deployment, the computer system may operate in the capacity of an IPTV server. The computer system 700 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a control system, a web appliance, a network router, switch or bridge, or any other machine capable of executing a set of instructions (sequential or otherwise) that specify actions to be taken by that machine. In a particular embodiment, the computer system 700 can be implemented using electronic devices that provide voice, video or data communication. Further, while a single computer system 700 is illustrated, the term "system" shall also be taken to include any collection of systems or sub-systems that individually or jointly execute a set, or multiple sets, of instructions to perform one or more computer functions.

As illustrated in FIG. 7, the computer system 700 may include a processor 702, e.g., a central processing unit (CPU), a graphics-processing unit (GPU), or both. Moreover, the computer system 700 can include a main memory 704 and a static memory 706 that can communicate with each other via a bus 708. As shown, the computer system 700 may further include a video display unit 710, such as a liquid crystal display (LCD), an organic light emitting diode (OLED), a flat panel display, a solid state display, or a cathode ray tube (CRT). Additionally, the computer system 700 may include an input device 712, such as a keyboard, and a cursor control device 714, such as a mouse. Further, the computer system 700 can include a wireless input device 715, e.g., a remote control device. The computer system 700 can also include a disk drive unit 716, a signal generation device 718, such as a speaker or remote control, and a network interface device 720.

In a particular embodiment, as depicted in FIG. 7, the disk drive unit 716 may include a computer-readable medium 722 in which one or more sets of instructions 724, e.g. software, can be embedded. Further, the instructions 724 may embody one or more of the methods or logic as described herein. In a particular embodiment, the instructions 724 may reside completely, or at least partially, within the main memory 704, the static memory 706, and/or within the processor 702 during execution by the computer system 700. The main memory 704 and the processor 702 also may include computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 724 or receives and executes instructions 724 responsive to a propagated signal, so that a device connected to a network 726 can communicate voice, video or data over the network 726. Further, the instructions 724 may be transmitted or received over the network 726 via the network interface device 720.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In accordance with various embodiments, the methods described herein may be implemented as one or more software programs running on a computer processor. Dedicated hardware implementations including, but not limited to, application specific integrated circuits, programmable logic arrays and other hardware devices can likewise be constructed to implement the methods described herein. Furthermore, alternative software implementations including, but not limited to, distributed processing or component/object distributed processing, parallel processing, or virtual machine processing can also be constructed to implement the methods described herein.

It should also be noted that software that implements the disclosed methods may optionally be stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. The software may also utilize a signal containing computer instructions. A digital file attachment to e-mail or other self-contained information archive or set of archives is considered a distribution medium equivalent to a tangible storage medium. Accordingly, the disclosure is considered to include a tangible storage medium or distribution medium as listed herein, and other equivalents and successor media, in which the software implementations herein may be stored.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of correcting video data errors, the method comprising:
   receiving a plurality of Internet Protocol (IP) video data packets at a generator of a video acquisition system;
   calculating a first error correction code and generating a first forward error correction (FEC) packet to produce the first error correction code;
   placing the IP video data packets into a first queue that has an associated first error profile that corresponds to the first error correction code;
   calculating a second error correction code and generating a second FEC packet to produce the second error correction code;
   placing the IP video data packets into a second queue that has an associated second error profile that is different from the first error profile, wherein the second error profile corresponds to the second error correction code; and
   transmitting a stream of data packets including the plurality of IP video data packets, the first FEC packet and the second FEC packet, to a re-generator of an Internet Protocol video transport system, wherein an arbitrator of the re-generator identifies an error in the plurality of IP video data packets and selects one of a plurality of inverse FEC functions to correct the error.

2. The method of claim 1, wherein the first error profile includes a first packet loss characteristic and the second error profile includes a second packet loss characteristic.

3. The method of claim 1, further comprising:
   buffering the plurality of IP video data packets in the first queue until the first FEC packet is generated; and
   buffering the plurality of IP video data packets in the second queue until the second FEC packet is generated.

4. The method of claim 1, further comprising:
   calculating a next error correction code corresponding to a next error profile and generating a next FEC packet to produce the next error correction code; and
   wherein the next FEC packet is included in the stream of data packets.

5. A system to correct video data errors, the system comprising:
   a generator having a processor and a memory device;
   wherein the memory device includes a data packet module executable by the processor to receive a plurality of Internet Protocol (IP) video data packets;
   wherein the memory device includes a queue module executable by the processor to maintain a plurality of queues, wherein each queue is associated with a different error profile of a plurality of error profiles;
   wherein the memory device includes a forward error correction (FEC) module executable by the processor to calculate a plurality of error correction codes for the plurality of IP video data packets, each error correction code corresponding to one of the plurality of error profiles;
   wherein the FEC module is executable by the processor to generate a plurality of FEC packets, each FEC packet associated with one of the plurality of error correction codes;
   wherein the memory device includes a transmission module executable by the processor to transmit a stream of data packets including the plurality of IP video data packets and the plurality of FEC packets to a re-generator of an Internet Protocol video transport system; and
   wherein the re-generator identifies an error in the plurality of IP video data packets and selects one of a plurality of inverse FEC functions to correct the error.

6. The system of claim 5, wherein at least one of a first error correction code and a second error correction code of the plurality of error correction codes includes a Pro-Moving Picture Experts Group Code of Practice 3-based (Pro-MPEG COP3-based) code, a Reed-Solomon code, a Luby Transform code, a Raptor code, a Golay code, a Hamming code, a Bose/Ray-Chaudhuri/Hocquenghem (BCH) code, a turbo-based code, a convolutional code, an interleaver, or any combination thereof.

7. The system of claim 5, wherein the generator receives the plurality of IP video data packets from a satellite video acquisition system.

8. The system of claim 5, further comprising a transmitter interface to transmit the stream of data packets to the re-generator.

9. A system to correct video data errors, the system comprising:
- a re-generator having a processor and a memory device;
- wherein the memory device includes a data packet receipt module executable by the processor to receive a stream of data packets including a plurality of initial Internet Protocol (IP) video data packets and a plurality of forward error correction (FEC) packets, wherein each FEC packet is generated by a different generator queue of a plurality of generator queues, wherein each generator queue has a different associated error profile of a plurality of error profiles;
- wherein the memory device includes an error module executable by the processor to determine that the plurality of initial IP video data packets includes an error having one of the plurality of error profiles; and
- wherein the memory device includes an arbitrator module executable by the processor to select one of a plurality of inverse FEC functions to correct the error.

10. The system of claim 9, wherein the arbitrator module is executable by the processor to identify one of the plurality of FEC packets, wherein the identified FEC packet is associated with an error correction code corresponding to an error profile of one of the plurality of error profiles.

11. The system of claim 9, further comprising an inverse FEC module executable by the processor to calculate each of the plurality of inverse FEC functions, wherein each of the plurality of inverse FEC functions corresponds to one of the plurality of FEC packets.

12. The system of claim 11, wherein the inverse FEC module is executable by the processor to produce a plurality of inverse FEC blocks, each inverse FEC block associated with one of the plurality of inverse FEC functions.

13. The system of claim 9, further comprising a receiver queue module executable by the processor to buffer each of the plurality of FEC packets in one of a plurality of receiver queues.

14. The system of claim 9, further comprising a downstream transmission module executable by the processor to send a corrected stream of IP video data packets to a video server of an Internet Protocol Television (IPTY) system, wherein the corrected stream of IP video data packets includes at least one reconstructed IP video data packet.

15. A computer program embedded in a computer-readable storage medium, the computer program comprising:
- instructions to receive a plurality of Internet Protocol (IP) video data packets;
- instructions to calculate a plurality of error correction codes for the plurality of IP video data packets, each error correction code corresponding to one of a plurality of error profiles, wherein each error profile corresponds to a different queue of a plurality of queues;
- instructions to generate a plurality of FEC packets, each FEC packet associated with one of the plurality of error correction codes; and
- instructions to transmit a stream of data packets including the plurality of IP video data packets and the plurality of FEC packets to a re-generator of an Internet Protocol video transport system, wherein an arbitrator of the re-generator identifies an error in the plurality of IP video data packets and selects one of a plurality of inverse FEC functions to correct the error.

16. The computer program of claim 15, wherein the plurality of FEC packets does not exceed a pre-defined proportion of the plurality of IP video data packets.

* * * * *